(12) United States Patent
Adderly et al.

(10) Patent No.: US 9,275,868 B2
(45) Date of Patent: Mar. 1, 2016

(54) UNIFORM ROUGHNESS ON BACKSIDE OF A WAFER

(71) Applicant: INTERNATIONAL BUSINESS MACHINES CORPORATION, Armonk, NY (US)

(72) Inventors: Shawn A. Adderly, Essex Junction, VT (US); Jeffrey P. Gambino, Westford, VT (US); Max L. Lifson, S. Burlington, VT (US); Matthew D. Moon, Jeffersonville, VT (US); William J. Murphy, North Ferrisburgh, VT (US); Timothy D. Sullivan, Underhill, VT (US); David C. Thomas, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 139 days.

(21) Appl. No.: 13/946,456

(22) Filed: Jul. 19, 2013

(65) Prior Publication Data
US 2015/0021743 A1   Jan. 22, 2015

(51) Int. Cl.
*H01L 21/308* (2006.01)
*H01L 21/306* (2006.01)
*H01L 21/3065* (2006.01)

(52) U.S. Cl.
CPC ...... *H01L 21/30604* (2013.01); *H01L 21/3065* (2013.01); *H01L 21/3083* (2013.01)

(58) Field of Classification Search
USPC .......................................... 257/618; 438/694
See application file for complete search history.

(56) References Cited

U.S. PATENT DOCUMENTS

| 4,137,123 | A  | 1/1979  | Bailey et al. |
| 5,296,385 | A  | 3/1994  | Moslehi et al. |
| 5,810,933 | A  | 9/1998  | Mountsier et al. |
| 6,100,150 | A  | 8/2000  | Shih et al. |
| 6,462,381 | B1 | 10/2002 | Beebe et al. |
| 6,787,797 | B2 | 9/2004  | Demizu et al. |
| 6,812,094 | B2 | 11/2004 | Goldbach et al. |
| 6,893,507 | B2 | 5/2005  | Goodman et al. |
| 6,916,373 | B2 | 7/2005  | Nakamura |
| 7,749,870 | B2 | 7/2010  | Kawai et al. |
| 2002/0004265 | A1 | 1/2002 | Vepa et al. |

(Continued)

FOREIGN PATENT DOCUMENTS

| JP | 2006173425    | 6/2006 |
| JP | 2011017069 A  | 1/2011 |

OTHER PUBLICATIONS

Black, et al., "Polymer self assembly in semiconductor microelectronics", J. Res. & Dev. vol. 51, No. 5, Sep. 2007, pp. 605-633.

(Continued)

*Primary Examiner* — Zandra Smith
*Assistant Examiner* — Lawrence Tynes, Jr.
(74) *Attorney, Agent, or Firm* — Michael LeStrange; Andrew M. Calderon; Roberts Mlotkowski Safran & Cole, P.C.

(57) ABSTRACT

Substrates (wafers) with uniform backside roughness and methods of manufacture are disclosed. The method includes forming a material on a backside of a wafer. The method further includes patterning the material to expose portions of the backside of the wafer. The method further includes roughening the backside of the wafer through the patterned material to form a uniform roughness.

20 Claims, 4 Drawing Sheets

(56) References Cited

U.S. PATENT DOCUMENTS

| | | | |
|---|---|---|---|
| 2005/0156481 A1* | 7/2005 | Zhou | G02B 26/0808 310/309 |
| 2005/0158889 A1 | 7/2005 | Brouillette et al. | |
| 2009/0087994 A1* | 4/2009 | Lee | H01L 21/30617 438/704 |
| 2009/0286346 A1* | 11/2009 | Adkisson | H01L 27/14618 438/65 |
| 2010/0019385 A1 | 1/2010 | Bartley et al. | |
| 2010/0178615 A1* | 7/2010 | Colburn et al. | 430/323 |
| 2010/0279488 A1 | 11/2010 | Akiyama | |
| 2011/0059299 A1* | 3/2011 | Kim | B81C 1/00031 428/195.1 |
| 2011/0206843 A1 | 8/2011 | Gurary et al. | |
| 2011/0268384 A1* | 11/2011 | Akkaya et al. | 385/12 |
| 2012/0107522 A1 | 5/2012 | Yumoto | |
| 2012/0168898 A1* | 7/2012 | Fucsko | H01L 21/30608 257/506 |

OTHER PUBLICATIONS

Scott Drews "Single Wafer Surface Conditioning", SEZ America, Inc., Aug. 1, 2007, printed on Jul. 19, 2013 from http://www.electroiq.com/articles/ap/print/volume-16/issue-6/features/cover-story/single-wafer-surface-conditioning.html, 4 pages.

* cited by examiner

UNIFORM ROUGHNESS ON BACKSIDE OF A WAFER

FIELD OF THE INVENTION

The invention relates to semiconductor structures and, more particularly, to wafers with uniform backside roughness and methods of manufacture.

BACKGROUND

Backside roughness variation on incoming silicon-on-insulator (SOI) wafers (or other types of wafers) causes measurable process variations that result in negative effects on yield. In particular, less backside roughness has resulted in poor etch performance due to a decrease in wafer temperature (increased contact to chuck, which sinks heat), which leads to lower etch selectivity.

By way of example, variations in backside roughness between vendors and even wafers received from the same vendor, results in lower etch selectivity which, in turn, results in different contact resistance. Due to the backside roughness variations amongst different vendors or even different lots of the same vendor, random variations still occur which make it difficult to adjust process variations. Techniques to overcome these issues have been tried, but not with success.

For example, gas flow can be adjusted to correct the temperature, but due to variations among vendors, there still remains a concern that such adjustments cannot be made with much consistency. Physical polishing techniques add cost. In addition, polishing may still be inadequate for controlling this problem because there may be variation in roughness after the polish. Also, grinding processes can degrade the integrity of the substrate and current chucking methods involve adhering the front side of the wafer to a glass plate. This latter process may disturb the incoming clean top surface of the wafer, which is critical to front end processing.

Accordingly, there exists a need in the art to overcome the deficiencies and limitations described hereinabove.

SUMMARY

In an aspect of the invention, a method comprises forming a material on a backside of a wafer. The method further comprises patterning the material to expose portions of the backside of the wafer. The method further comprises roughening the backside of the wafer through the patterned material to form a uniform roughness.

In an aspect of the invention, a method comprises forming a material on a backside of a substrate. The method further comprises forming a protective layer on a front side of the substrate. The method further comprises forming openings in the material to expose the backside of the substrate. The method further comprises patterning the backside of the substrate through the openings to form a controlled topography on the backside of the substrate comprising a uniform roughness across chips. The method further comprises removing the material and protective layer.

In an additional aspect of the invention, a structure comprises a wafer having a backside with a uniform roughness across chips, which comprises indentations with sloped sidewalls. The indentations having a depth of about 500 Å to about 1 micron and the sloped sidewalls having a slope of less than 90°.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to wafers or substrates with uniform backside roughness and methods of manufacture. In embodiments, the present invention provides techniques for increasing the roughness and uniformity of the backside of a wafer, which is preferably silicon on insulator (SOI). In embodiments, though, the wafer can be any known substrate such as, for example, a bulk wafer, silicon, sapphire or glass as non-limiting examples. By implementing the processes of the present invention, the roughened surface will be dominant relative to any incoming wafer roughness variability.

In embodiments, the roughness can be provided by different techniques including, for example, reactive ion etching (RIE) processes, argon sputtering or techniques implementing a di-block copolymer. In embodiments, the techniques of the present invention can result in different patterns with, for example, uniform plateaus or indentations on the backside of the wafer (substrate) and across chips. For example, the backside of the wafer or substrate can have a roughness, e.g., a designed, repeating array of structures which creates a controlled topography.

Advantageously, by implementing the processes of the present invention, it is now possible to eliminate backside roughness variations of incoming wafers received from vendors, whether from different vendors or wafers received from the same vendor. In embodiments, the elimination of backside roughness variations will, in turn, reduce the amount of process variability in subsequent processes, e.g., etching of through vias, etc., thereby increasing yield. That is, the preconditioning processing in accordance with the present invention will reduce subsequent variability exacerbated by non-uniform backside roughness from wafer to wafer and/or vendor to vendor during subsequent process steps. Also, by implementing the processes of the present invention, it is possible to tailor backside roughness characteristics to match desired thermal distribution for subsequent processes. In this way, it is possible to ensure uniform processing of wafers received from different vendors or wafers received from the same vendor, thereby increasing the overall yield of the product.

FIGS. 1-5 show structures and respective processing steps in accordance with aspects of the present invention. It should be understood by those of skill in the art that the processes of manufacturing the structures of the present invention and other components can be manufactured in a number of ways using a number of different tools. In general, though, the methodologies and tools are adopted from integrated circuit (IC) technology to form the structures with specific dimensions. For example, the structures of the present invention, e.g., backside roughness, is fabricating using photolithographic processes, laser ablation techniques and/or di-block copolymers.

Figure 1:
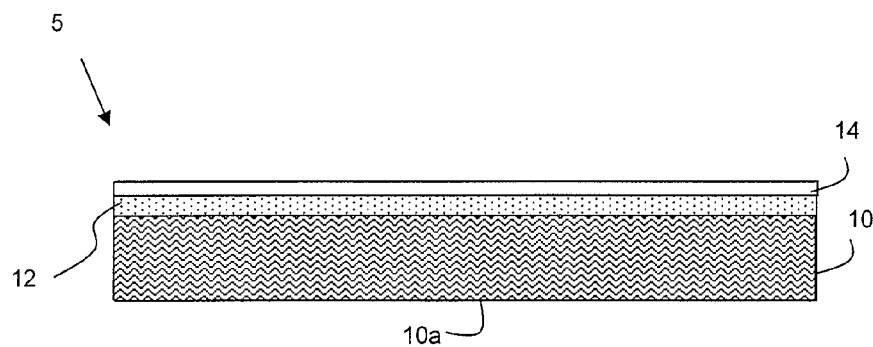
FIGS. 1-5 show structures and respective processing steps in accordance with aspects of the present invention.

More specifically, as shown in FIG. 1, the structure of the present invention is representative of a wafer 5. In embodiments, although the exemplary wafer 5 described herein is silicon-on-insulator (SOI), the present invention can also be implemented with any wafer, e.g., wafer, such as a bulk wafer, silicon, sapphire or glass as non-limiting examples. It should be understood by those of skill in the art that the constituent materials of the SOI wafer 5 may be selected based on the desired end use application of the semiconductor device. For example, in the exemplary described embodiment, the silicon-on-insulator wafer 5 includes a substrate 10 which can be, for example, a high resistivity handle wafer, glass, silicon or other known substrate. A backside 10a of the substrate typically has a non-uniform roughness or, alternatively, different wafers can have different roughness, with any such scenario affecting subsequent processing.

Still referring to FIG. 1, an insulation layer 12, e.g., BOX, can be bonded to the substrate 10. In embodiments, the insulator layer 12 can be composed of oxide, such as $SiO_2$; although other insulator materials are also contemplated by the present invention. Moreover, an active semiconductor layer 14 can be comprised of various semiconductor materials, such as, for example, Si or other Si based material such as SiGe.

Figure 2:
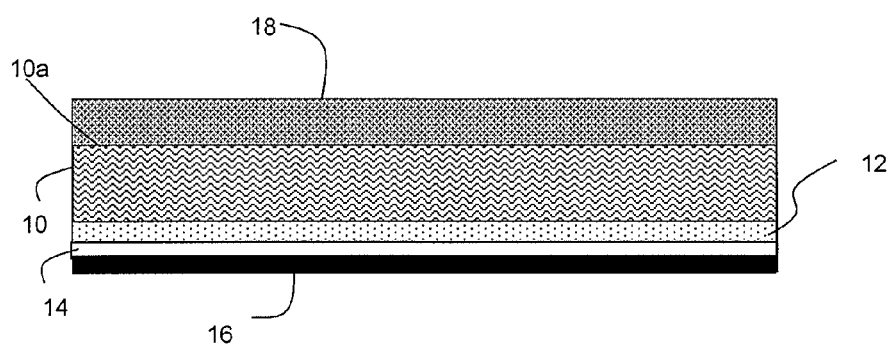

In FIG. 2, a sacrificial material 16 is formed on the active semiconductor layer 14, in order to protect the active semiconductor layer 14 during processes performed in accordance with the present invention. For example, the sacrificial material 16 will protect the integrity of the substrate when adhering the substrate to a chuck, e.g., ensure that the top surface of the wafer remains clean for front end processing. In embodiments, the sacrificial material 16 can be SiN or $SiO_2$, which can be blanket deposited on the semiconductor layer 14 using conventional deposition processes, e.g., chemical vapor deposition (CVD). A resist material 18, e.g., photosensitive material or polymer, is formed over the backside 10a of the substrate 10. In embodiments, the resist material 18 can be blanket deposited on the backside 10a of the substrate 10 using any known processes.

Figure 3:
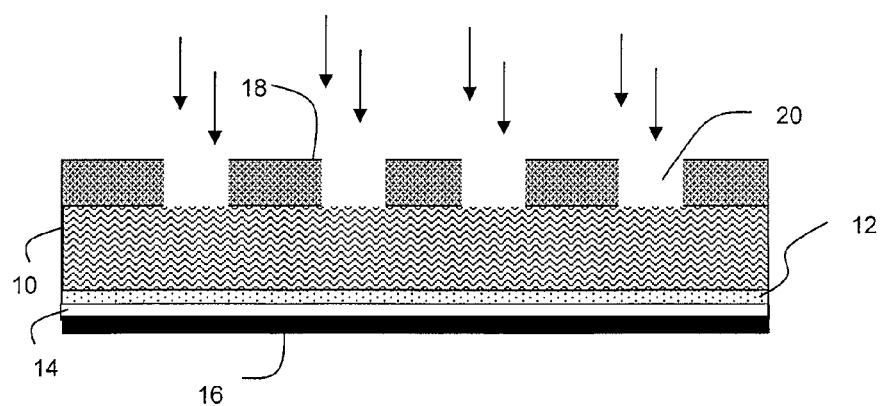

In FIG. 3, the resist material 18 can be patterned using conventional photolithographic and etching processes, known to those of skill in the art. For example, the resist material 18 can be exposed to energy (light) to form the pattern, e.g., openings 20. In embodiments, the pattern 20 can have a dimension of about 1 micron in width, and a space between the openings of about 1 micron; although other dimensions are also contemplated by the present invention. Preferably, though, 1 micron dimension or smaller will allow the processes of the present invention to create a uniform roughness that would dominate any roughness on the backside 10a of the substrate 10, as received from a vendor.

In an alternative embodiment, the resist material 18 can be patterned using conventional laser ablation techniques. For example, a wavelength of light can be selected that has absorption in the resist, but not in the substrate 10. In this way, the laser ablation process will not damage or melt the underlying substrate 10. In embodiments, the wavelength of the light would be within the infrared (IR) spectrum. As in the previous embodiment, the laser ablation technique will create a pattern 20 that has a dimension of about 1 micron in width, and a space between the openings of about 1 micron; although other dimensions are also contemplated by the present invention.

Figure 4:
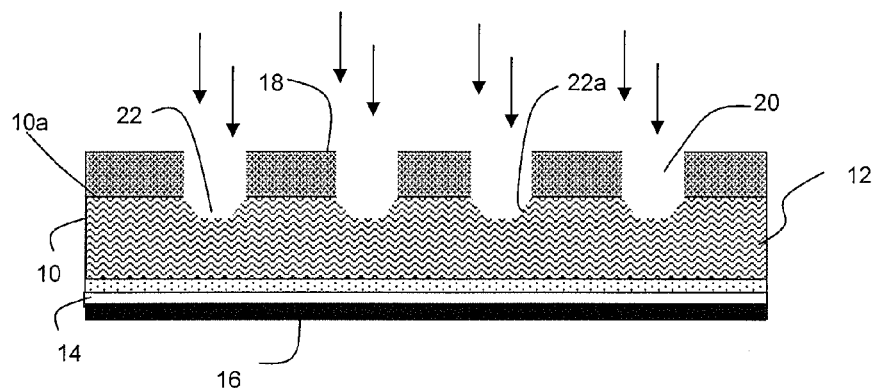

In FIG. 4, the substrate 10 can undergo either an etching process or an argon sputter, regardless of the manner in which the resist material 18 was patterned. For example, the substrate 10 can undergo a reactive ion etch (RIE) to form a roughness 22, e.g., a designed, repeating array of structures in the backside 10a of the substrate 10 which creates a controlled topography. The etching process can be, for example, a fluorine etch, e.g., $CF_4$, which chemically attacks the backside 10a of the substrate 10. Alternatively, the etching process can be, for example, a wet etch such as HF with nitric acid. As a further alternative, the substrate 10 can undergo an argon sputter (physical removal process) to form the controlled topography on the backside 10a of the substrate 10, e.g., roughness 22.

In embodiments, the roughness 22 comprises a plurality of recesses or indentations in the backside 10a of the substrate 10. These recesses or indentations can have a depth of about 500 Å to about 1 micron, for example. This depth will, for example, dominate or overcome any of the roughness of the substrate, as originally received from the vendor. In further embodiments, the recesses or indentations will also have a tapered slope 22a. The tapered slope 22a will prevent contaminants from being trapped within the roughness 22. In embodiments, the tapered slope can have an angle of less than 90° and, preferably about 30° to about 60°.

Figure 5:
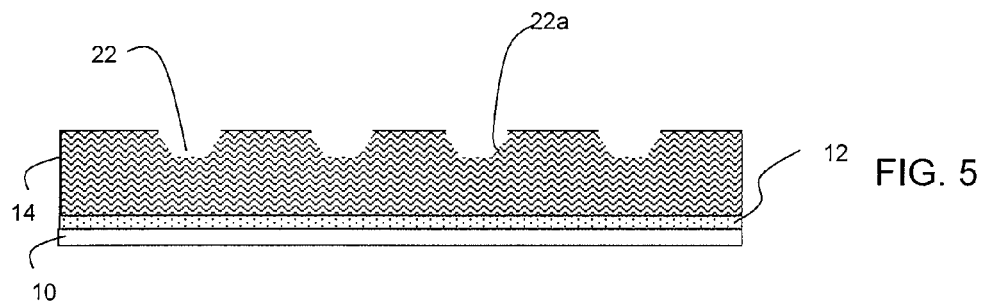

In FIG. 5, the resist material is removed using conventional oxygen ashing processes, for example. Also, the sacrificial material formed on the active semiconductor layer 14 can be removed using, for example, a chemical mechanical process (CMP), a wet etch, a dry etch, or other conventional stripping process.

Figures 6A, 6B, 6C:
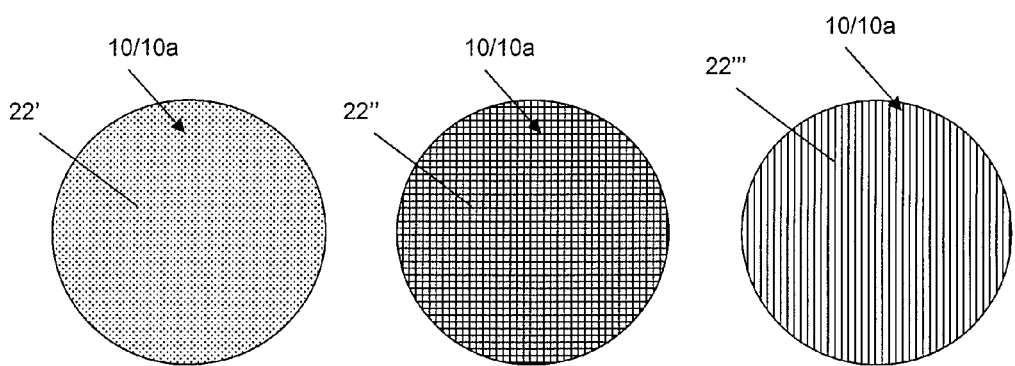
FIGS. 6a-6c show top views of several structures in accordance aspects of the present invention.

FIGS. 6a-6c show top views of several patterns formed in accordance with aspects of the present invention. More specifically, FIGS. 6a-6c show different roughness patterns on the backside 10a of the substrate 10. In embodiments, the different roughness patterns 22', 22" and 22' are exemplary, non-limiting examples of a uniformly distributed repeating array of structures in the backside 10a of the substrate 10, which creates the controlled topography. For example, FIG. 6a shows an array of uniformly distributed dimples or recesses 22' across the backside 10a of the substrate 10. In comparison, FIG. 6b shows a checkerboard pattern 22"; whereas, FIG. 6c shows a line pattern 22'". As contemplated in aspects of the present invention, the patterns on the underside 10a of the substrate 10 are uniformly distributed for each of the chips comprising the wafer (substrate 10).

Figure 7:
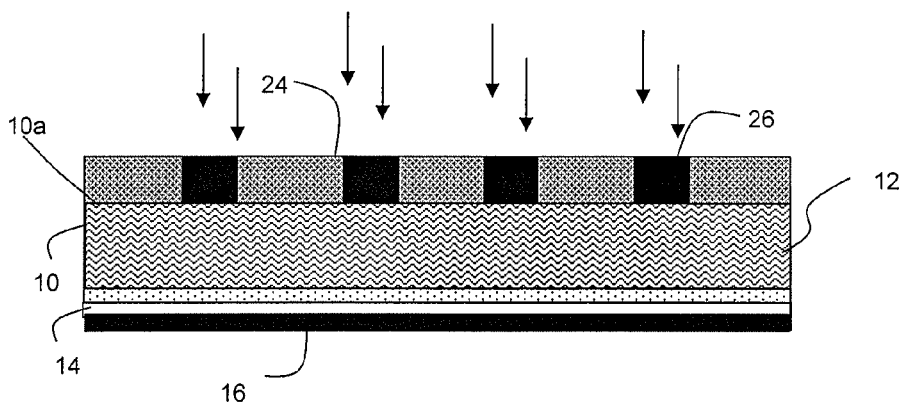
FIGS. 7-9 show structures and respective processing steps in accordance with additional aspects of the present invention.
Figures 8A, 8B, 8C, 8D:
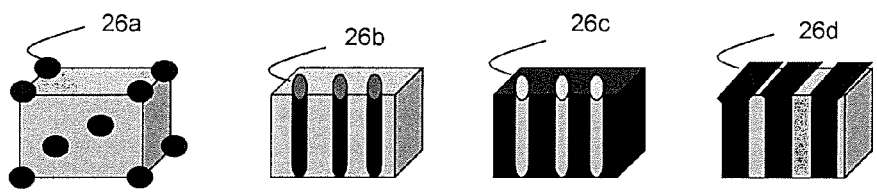
Figure 9:
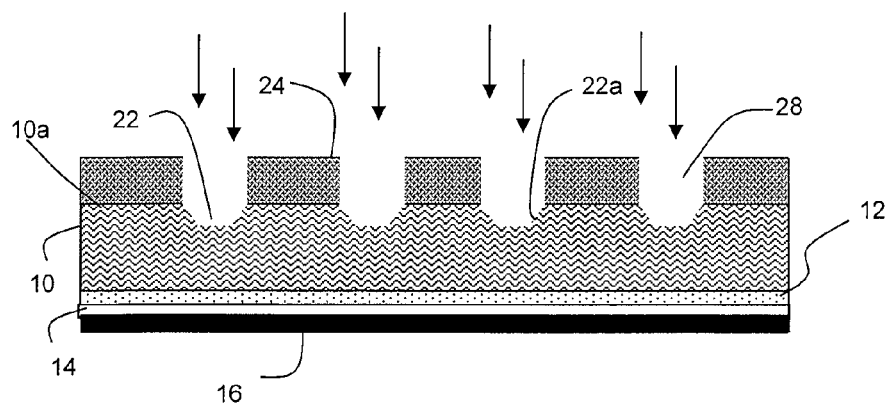

FIGS. 7-9 show structures and respective processing steps in accordance with additional aspects of the present invention. More specifically, in FIG. 7, a di-block copolymer 24 is deposited on the backside 10a of the substrate. In embodiments, the di-block copolymer 24 can uniformly cover any wafer sized, e.g., 300 mm, etc. In specific non-limiting embodiments, the di-block copolymer 24 is a self-assembled di-block copolymer 24, which can be deposited using, for example, a spin on process or other conventional deposition process known to those of skill in the art. By way of example, the self-assembled di-block copolymer 24 can be polystyrene-b-poly(methyl methacrylate) (PS-b-PMMA). In this example, the self-assembled di-block copolymer 24 is made by first polymerizing styrene, and then subsequently polymerizing MMA (PMMA) from the reactive end of the polystyrene chains.

The di-block copolymer 24 undergoes phase change as represented by reference numeral 26. In embodiments, this phase change can be achieved by an annealing process, e.g., at a temperature of about 60° C. to about 300° C. for about 5 minutes to about 1 hour. Thus, as shown in FIG. 7, by using the annealing process, the self-assembled di-block copolymer 24 can "microphase separate" to form periodic structures (e.g., 1 micron or less) as represented by reference numeral 26.

As shown in, for example, FIGS. 8a-8d, the structures can comprise many different configurations, depending on the processing conditions including the thickness of the material, the annealing conditions, relative amount of each material in the di-block copolymer 24, etc. For example, FIG. 8 shows the formation of spheres 26a and FIGS. 8b and 8c show the formation of cylinders 26b and 26c, respectively. In FIG. 8b, for example, the cylinders 26b can be PMMA; whereas, in FIG. 8c, for example, the cylinders 26c can be PS. In FIG. 8d, the shapes can be a lamellae pattern 26d. It should be understood by those of ordinary skill in the art that other shapes are also contemplated by the present invention.

FIG. 9 is representative of additional processing steps and structures according to aspects of the present invention. In this representation, an etching process will be performed using an organic solvent, dry etch, or thermal decomposition, selectively removing the structures 26 and hence forming openings 28 in the di-block copolymer 24. An additional etching process will also form the roughness 22 in the backside 10a of the substrate 10, similar to that already described herein. In embodiments, the etching process can be a dry or wet process as described herein. In embodiments, the resulting roughness is a uniformly distributed repeating array of structures in the backside 10a of the substrate 10, which creates the controlled topography. The pattern of these structures can be similar or the same to that disclosed with reference to FIGS. 6a-6c, as non-limiting examples. The di-block copolymer and sacrificial material can then be removed, resulting in the structure shown in FIG. 5 (or FIGS. 6a-6c).

Figure 10:
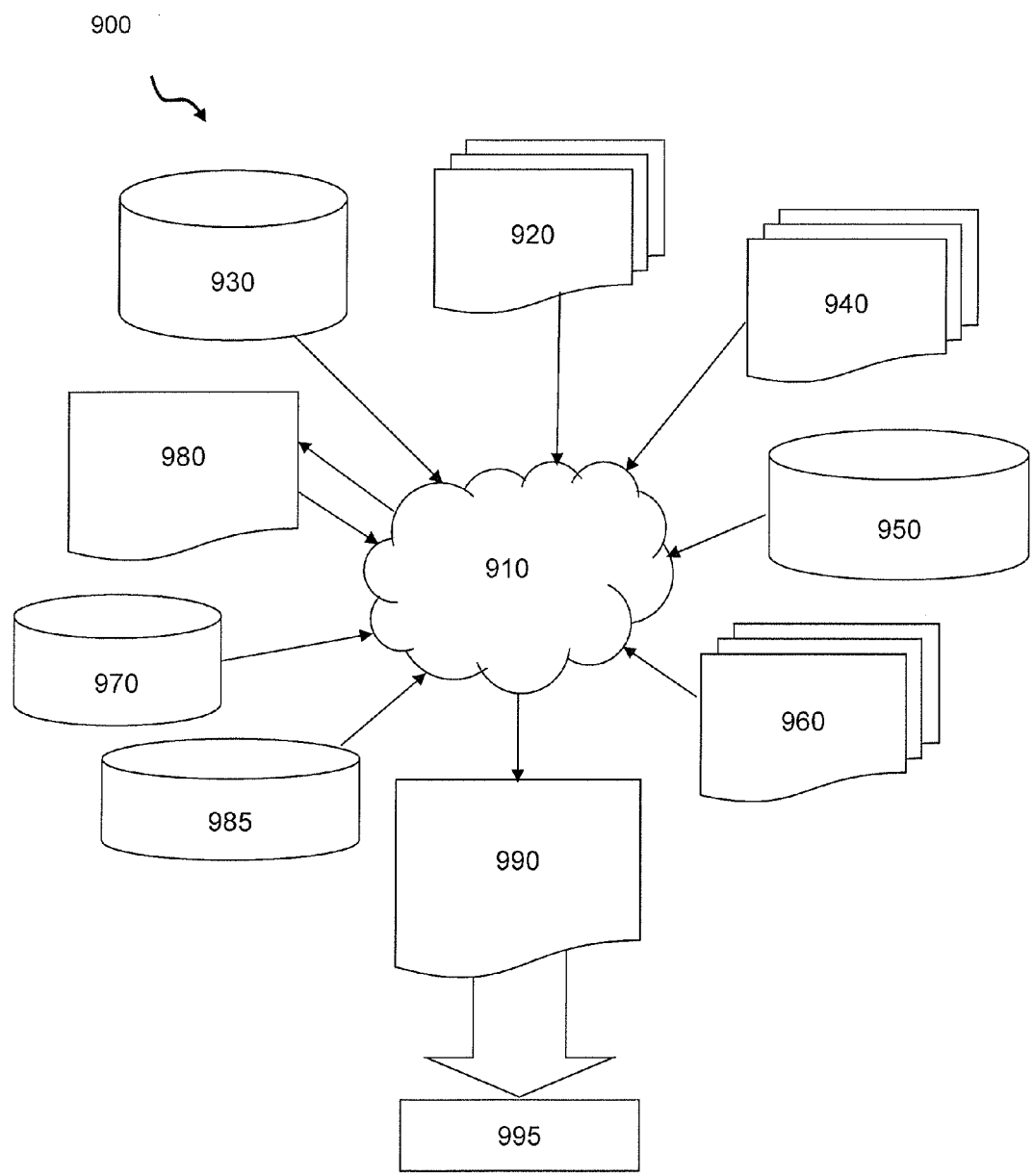
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5, 6a-6c, 7, 8a-8d and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5, 6a-6c, 7, 8a-8d and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5, 6a-6c, 7, 8a-8d and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5, 6a-6c, 7, 8a-8d and 9. In one embodiment, design structure 990 may comprise a compiled, executable HDL simulation model that functionally simulates the devices shown in FIGS. 1-5, 6a-6c, 7, 8a-8d and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5, 6a-6c, 7, 8a-8d and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a material on a backside of a wafer, wherein the backside is adapted to be part of a base of a semiconductor and an upper surface of the wafer is adapted to be in contact with semiconductor layers;
    patterning the material to expose portions of the backside of the wafer; and
    roughening the backside of the wafer through the patterned material to form a uniform roughness comprising a repeating array of structures of recesses or indentations in the backside of the wafer thus forming a controlled topography.

2. The method of claim 1, wherein:
    the material is a photoresist;
    the patterning is a photolithographic process; and
    the roughening is one of a wet etch process, dry etch process and argon sputtering process.

3. The method of claim 1, wherein:
    the material is a photoresist;
    the patterning is a laser ablation process; and
    the roughening is one of a wet etch process, dry etch process and argon sputtering process.

4. The method of claim 1, wherein:
    the material is a di-block copolymer;
    the patterning process comprises an annealing and etching process; and
    the roughening is one of a wet etch process, dry etch process and argon sputtering process.

5. The method of claim 1, wherein the uniform roughness comprises the indentations with sloped sidewalls.

6. The method of claim 1, wherein the indentations have a depth of about 500 Å to about 1 micron.

7. The method of claim 6, wherein the sloped sidewalls have a slope of less than 90°.

8. The method of claim 7, wherein the sloped sidewalls have a slope of between about 30° to about 60°.

9. The method of claim 1, wherein the wafer is a silicon on insulator (SOI) and the uniform roughness is a pattern of uniformly distributed repeating array of structures on an underlying backside of a substrate for each chip of the wafer.

10. The method of claim 9, wherein the uniform roughness is one of:
    a pattern of uniformly distributed dimples or the recesses across the backside of the substrate;
    a checkerboard pattern; and
    a line pattern.

11. The method of claim 1, further comprising implementing the steps of claim 1 over a plurality of wafers to provide a matching uniform roughness on a backside of each of the plurality of wafers.

12. A method, comprising:
    forming a material on a backside of a substrate;
    forming a protective layer on a front side of the substrate;
    forming openings in the material to expose the backside of the substrate;
    patterning the backside of the substrate through the openings to form a controlled topography on the backside of the substrate comprising a uniform roughness across chips comprising a repeating array of structures of recesses or indentations; and
    removing the material and protective layer.

13. The method of claim 12, wherein:
    the material is a photoresist;
    the forming openings is a photolithographic process; and
    the patterning is one of a wet etch process, dry etch process and argon sputtering process.

14. The method of claim 12, wherein:
    the material is a photoresist;
    the forming openings is a laser ablation process; and
    the patterning is one of a wet etch process, dry etch process and argon sputtering process.

15. The method of claim 12, wherein:
    the material is a di-block copolymer;
    the forming openings comprises an annealing and etching process; and
    the patterning is one of a wet etch process, dry etch process and argon sputtering process.

16. The method of claim 15, wherein di-block copolymer is poly(methyl methacrylate) (PS-b-PMMA) and, upon annealing, the di-block copolymer changes phase to form a pattern of one of spheres, cylinders and lamellae.

17. The method of claim 12, wherein:
    the uniform roughness comprises the indentations with sloped sidewalls;
    the indentations have a depth of about 500 Å to about 1 micron; and
    the sloped sidewalls have a slope of less than 90°.

18. The method of claim 17, wherein the uniform roughness is one of:
    a pattern of uniformly distributed dimples or the recesses across the backside of the substrate;
    a checkerboard pattern; and
    a line pattern.

19. The method of claim 12, further comprising implementing the steps of claim 12 over a plurality of wafers to provide a matching uniform roughness on a backside of each of the plurality of wafers.

20. A structure, comprising a wafer having a backside adapted to be part of a base of a semiconductor and an upper surface adapted to be in contact with semiconductor layers, the backside with a uniform roughness across chips, comprising indentations with sloped sidewalls, the indentations having a depth of about 500 Å to about 1 micron and the sloped sidewalls having a slope of less than 90°.

* * * * *